(12) United States Patent
Yang et al.

(10) Patent No.: US 9,634,273 B2
(45) Date of Patent: Apr. 25, 2017

(54) METHOD FOR PRODUCING FULLY AQUEOUS PHASE-SYNTHESIZED NANOCRYSTALS/CONDUCTING POLYMER HYBRID SOLAR CELL

(75) Inventors: Bai Yang, Changchun (CN); Weili Yu, Changchun (CN); Hao Zhang, Changchun (CN); Junhu Zhang, Changchun (CN); Haotong Wei, Changchun (CN); Zhanxi Fan, Changchun (CN)

(73) Assignee: JILIN UNIVERSITY, Jilin (CN)

( * ) Notice: Subject to any disclaimer, the term of this patent is extended or adjusted under 35 U.S.C. 154(b) by 1111 days.

(21) Appl. No.: 13/813,628

(22) PCT Filed: May 13, 2011

(86) PCT No.: PCT/CN2011/074038
§ 371 (c)(1),
(2), (4) Date: Mar. 12, 2013

(87) PCT Pub. No.: WO2012/019472
PCT Pub. Date: Feb. 16, 2012

(65) Prior Publication Data
US 2013/0164881 A1 Jun. 27, 2013

(30) Foreign Application Priority Data
Aug. 9, 2010 (CN) .......................... 2010 1 0247438

(51) Int. Cl.
H01L 21/00 (2006.01)
H01L 51/42 (2006.01)
H01L 51/00 (2006.01)

(52) U.S. Cl.
CPC ........ H01L 51/426 (2013.01); H01L 51/4213 (2013.01); H01L 51/0003 (2013.01); H01L 51/0038 (2013.01); Y02E 10/549 (2013.01)

(58) Field of Classification Search
CPC ............... H01L 51/426; H01L 51/4213; H01L 51/0038; H01L 51/0003; H01L 2031/0344;
(Continued)

(56) References Cited

U.S. PATENT DOCUMENTS

2004/0115448 A1* 6/2004 Bibber .................... C23C 22/57
428/471
2010/0096002 A1* 4/2010 Hayashi ................... H01B 1/22
136/252

(Continued)

FOREIGN PATENT DOCUMENTS

CN 1743361 A 3/2006
CN 101969102 A 2/2011

OTHER PUBLICATIONS

Lin, Y.-Y, et al., 2007,"Nanostructured Metal Oxide/Conjugated Polymer Hybrid Solar Cells by Low Temperature Solution Processes," *Journal of Materials Chemistry* 17: 4571-4576.

Primary Examiner — Julio J Maldonado
Assistant Examiner — Stanetta Isaac
(74) Attorney, Agent, or Firm — Knobbe, Martens, Olson & Bear LLP

(57) ABSTRACT

Provided is a method for producing a highly efficient organic/inorganic hybrid solar cell using fully aqueous phase-synthesized semiconductor nanocrystals and conducting polymer. The method mainly includes three steps: synthesizing nanocrystals in an aqueous phase, synthesizing a conjugated polymer precursor in an aqueous phase, and producing a device of solar cell. The nanocrystal material required for producing a solar cell by the method is widely available, diversified and size-controlled, and the used conjugated polymer has regulated molecular structure and molecular weight, which contributes to increase the absorption of sunlight. The processing of cell device can be (Continued)

performed at room temperature in air, and has advantages of no pollution, short processing period, and low cost. A method for producing an organic/inorganic hybrid solar cell is developed, which succeeds in introducing the high quality nanocrystals synthesized in an aqueous phase and is an eco-friendly and pollution-free technology for producing a solar cell.

12 Claims, 3 Drawing Sheets

(58) Field of Classification Search
CPC ....... H01L 25/047; H01L 27/30; H01L 51/42; H01L 31/0272; H01L 31/0322; H01L 31/0296; Y02E 10/549
See application file for complete search history.

(56) References Cited

U.S. PATENT DOCUMENTS

| | | |
|---|---|---|
| 2010/0116326 A1 | 5/2010 | Gur et al. |
| 2013/0075665 A1* | 3/2013 | Park .................. B82Y 5/00 252/500 |

* cited by examiner

METHOD FOR PRODUCING FULLY AQUEOUS PHASE-SYNTHESIZED NANOCRYSTALS/CONDUCTING POLYMER HYBRID SOLAR CELL

TECHNICAL FIELD

The present invention pertains to the field of the solar cell technology, and specifically, relates to a method for producing a highly efficient organic/inorganic hybrid solar cell by using fully aqueous phase-synthesized semiconductor nanocrystals and conducting polymer.

BACKGROUND ART

As the demand for energy sources increases and the reserve of the fossil-type (coal, petroleum and natural gas) energy sources decreases, it becomes a pressing issue for the present scientific research to find new replaceable energy sources. In recent years, solar cells, especially, organic solar cells, have become the focus of research and development in solar cells of the next generation due to their advantages of convenient processing, low cost, low energy consumption, no pollution and the like. At present, there are mainly following two methods for producing an organic solar cell: a spin-coating film formation method and a vacuum vapor deposition method, which are applicable to the conjugated polymer systems and the organic small molecule systems, respectively. A disadvantage of the organic solar cells is that the carrier mobility of organic materials is low, which will affect the overall photoelectric conversion efficiency thereof.

It has become a problem necessary to be solved for the researchers in the field about how to improve the carrier mobility of organic materials, and increase the absorption of sunlight as much as possible so as to improve photoelectric conversion efficiency of organic solar cells. If an organic/inorganic hybrid solar cell is produced by compounding inorganic nanocrystals with high carrier mobility and an organic polymer, and then using the related film-forming technologies, the absorption of sunlight and the mobility of photogenerated carriers, and thus photoelectric conversion efficiency of organic solar cells can be efficiently improved. At present, there are some related researches and reports of organic/inorganic hybrid solar cells using the technology of production and dispersion in an organic phase. However, the processing and range of material selection for the organic/inorganic hybrid cell devices are still limited mainly due to the volatility, toxicity and hydrophobicity of the organic solvents, complex process of preparing materials, as well as higher demands for the experimental conditions.

DISCLOSURE OF THE INVENTION

It is an object of the invention to provide a method for producing an organic/inorganic hybrid solar cell by using a fully aqueous phase-synthesized polymer and nanocrystals. This method for producing a solar cell has advantages of widely available material sources, low cost, simple and fast processing and eco-friendly and pollution-free experimental conditions. Thus, a new route for producing a high efficient and eco-friendly solar cell is developed.

The invention provides a method for producing a fully aqueous phase-synthesized semiconductor nanocrystals/conducting polymer hybrid solar cell, comprising:
(1) a step of preparing an aqueous semiconductor nanocrystal solution in an aqueous phase;
(2) a step of preparing an aqueous conjugated polymer precursor solution in an aqueous phase; and
(3) a step of producing a nanocrystals/conducting polymer hybrid solar cell, comprising:
firstly adding isopropanol to the aqueous semiconductor nanocrystal solution and subjecting the resulting solution to centrifugal sedimentation at high speed so as to obtain a nanocrystal precipitate;
then mixing the semiconductor nanocrystal precipitate with the conjugated polymer precursor solution in a mass ratio of 1:1 to 10:1;
forming a film with a thickness of 20 nm to 500 nm by spin-coating the mixed solution onto a surface of a conducting anode or the surface of a conducting anode covered with an electron blocking layer;
after drying the film, forming an active layer having an interpenetrating network structure of the conjugated polymer and the semiconductor nanocrystals by transferring the film into a glove box filled with nitrogen gas and heating it for 10 to 120 min; and
finally evaporating or spin-coating a hole blocking layer and a metal cathode on the active layer in this order by transferring the device into a vacuum evaporation apparatus so as to produce the nanocrystals/conducting polymer hybrid solar cell.

According to the method of the invention, the conjugated polymer is poly(para-phenylene vinylene), poly(2,5-dialkoxy-para-phenylene vinylene), or poly(phenylene vinylene-co-2,5-dialkoxy-para-phenylene vinylene).

According to the method of the invention, the poly(para-phenylene vinylene) precursor solution is prepared by the steps of:
(1) adding p-di(chloromethyl)benzene and thiophane to a three-necked flask equipped with a stirrer, a condenser and a thermometer in a molar ratio of 1:3, and using 20-60 ml of methanol (a good solvent for the conjugated polymer) as the reaction medium; reacting the mixture in an oil bath at 50° C.-60° C. for 24-48 h while keeping the concentration of p-di(chloromethyl)benzene in methanol (a good solvent for the conjugated polymer) in a range of 8.57 mM-25.7 mM; then adding 125-375 ml of cold acetone at 0° C. to the reaction solution; filtering the precipitated white precipitate and further washing with cold acetone for 5-8 times; and finally placing the precipitated product into a vacuum oven and drying it to a constant weight at 30-60° C. so as to obtain disulfonium dichloride of p-phenylene dimethylene α, α'-bisthiophane represented by the following structural formula:

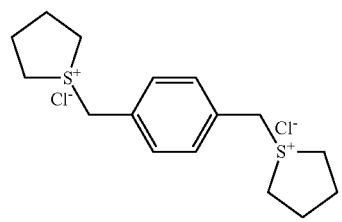 [SMILES: c1cc(C[S+]2CCCC2)ccc1C[S+]1CCCC1 ; [Cl-] ; [Cl-]]

(2) adding a methanol (a good solvent for the conjugated polymer) solution of 0.2-0.6 M disulfonium dichloride of p-phenylene dimethylene α, α'-bisthiophane and an aqueous solution of equal molar NaOH to a four-necked flask equipped with a constant pressure dropping funnel, a stirrer, a $N_2$ gas inlet tube and a $N_2$ gas outlet tube; keeping the solution at a temperature of 0-10° C., and performing the reaction for 0.5-2 h; then terminating the reaction by neutralization with 0.1-1 M of hydrochloric acid until pH becomes 6.5-7.5; then dialyzing the reaction product for 1 week with deionized water by pouring it into a dialysis bag with a cut-off molecular weight of 8000-14000 so as to remove the extra small molecules and obtain a solution of poly(para-phenylene vinylene) precursor with a mass concentration of 2%-5%, where poly(para-phenylene vinylene) is represented by the following structural formula:

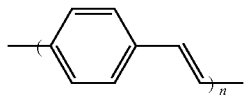

wherein, n is an integer of 392-980.

According to the method of the invention, the poly(2,5-dialkoxy-para-phenylene vinylene) precursor solution is prepared by the steps of:

(1) adding 2,5-dialkoxy-1,4-p-di(chloromethyl)benzene and thiophane to a three-necked flask equipped with a stirrer, a condenser and a thermometer in a molar ratio of 1:3, and using 20-60 ml of methanol (a good solvent for the conjugated polymer) as the reaction medium; reacting the mixture in an oil bath at 50° C.-60° C. for 24-48 h while keeping the concentration of 2,5-dialkoxy-1,4-p-di(chloromethyl)benzene in methanol (a good solvent for the conjugated polymer) in a range of 8.57 mM-25.7 mM; then adding 125-375 ml of cold acetone at 0° C. to the reaction solution; filtering the precipitated white precipitate and further washing with cold acetone for 5-8 times; and finally placing the precipitated product into a vacuum oven and drying it to a constant weight at 30-60° C. so as to obtain disulfonium dichloride of 2,5-dialkoxy-p-phenylene dimethylene α, α'-bisthiophane represented by the following structural formula:

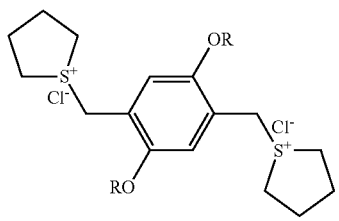

wherein, R is $C_mH_{2m+1}$, and m is an integer of 1-8.

(2) adding a methanol (a good solvent for the conjugated polymer) solution of 0.2-0.6 M disulfonium dichloride of 2,5-dialkoxy-p-phenylene dimethylene α, α'-bisthiophane prepared in the above step and an aqueous solution of equal molar NaOH to a four-necked flask equipped with a constant pressure dropping funnel, a stirrer, a $N_2$ gas inlet tube and a $N_2$ gas outlet tube; keeping the solution at a temperature of 0-10° C., and performing the reaction for 0.5-2 h; then terminating the reaction by neutralization with 0.1-1 M of hydrochloric acid until pH becomes 6.5-7.5; then dialyzing the reaction product for 1 week with deionized water by pouring it into a dialysis bag with a cut-off molecular weight of 8000-14000 so as to remove the extra small molecules and obtain a solution of poly(2,5-dialkoxy-para-phenylene vinylene) precursor with a mass concentration of 2%-5%, where the poly(2,5-dialkoxy-para-phenylene vinylene) is represented by the following structural formula:

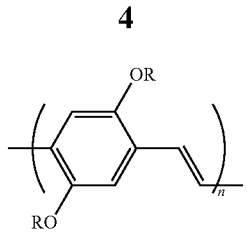

wherein, n is an integer of 392-980; R is $C_mH_{2m+1}$, and m is an integer of 1-8.

According to the method of the invention, the good solvent for the conjugated polymer precursor is water, methanol, ethanol, isopropanol, or a mixed solvent thereof.

According to the method of the invention, the semiconductor nanocrystals are CdTe, CdSe, or CdS.

According to the method of the invention, the material for the metal cathode is Ca, Mg, Al, Mg/Ag or Ca/Al.

According to the method of the invention, the material for the conducting anode is indium tin oxide or fluorine-doped $SnO_2$ conducting glass.

According to the method of the invention, the material for the electron blocking layer is poly(3,4-ethylenedioxythiophene)/poly(styrene sulfonic acid), molybdenum trioxide, vanadium pentoxide, or tungsten oxide.

According to the method of the invention, the material for the hole blocking layer is 2,9-dimethyl-4,7-diphenyl-1,10-ortho-phenanthroline, ZnO nanocrystals, $TiO_2$ nanocrystals, or LiF.

Figure 1:
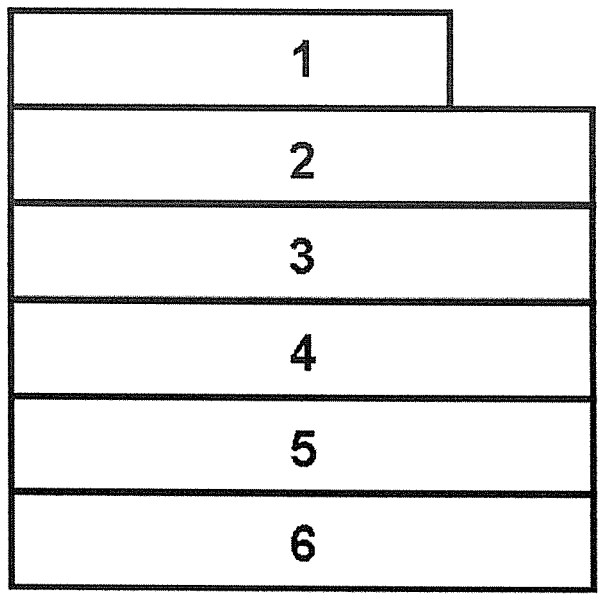
FIG. 1 shows a schematic view of a structure of the solar cell produced by the invention.

In the FIG. 1, the respective layers in the order from top to down are: 1. a metal cathode with a film thickness of 50 nm to 300 nm, whose specific material is, for example, Ca, Mg, Al, Mg/Ag or Ca/Al or the like; 2. a hole blocking layer, whose specific material is, for example, 2,9-dimethyl-4,7-diphenyl-1,10-ortho-phenanthroline (BCP) (with a film thickness of 1-10 nm), ZnO nanocrystals (with a film thickness of 20-40 nm), $TiO_2$ nanocrystals (with a film thickness of 20-40 nm), or LiF (with a thickness of 0.1-3.0 nm); 3. an active layer, whose specific material is, for example, PPV:CdTe composite film (50-800 nm), PPV:CdSe composite film (50-800 nm), PPV:CdS composite film (50-800 nm) or the like; 4. an electron blocking layer, whose specific material is, for example, PEDOT:PSS (with a film thickness of 20-50 nm), $MoO_3$ (with a film thickness of 1-10 nm), $V_2O_5$ (with a film thickness of 1-10 nm), or $WO_3$ (with a film thickness of 1-10 nm); 5. a conducting anode, whose specific material is, for example, indium tin oxide (ITO), fluorine-doped $SnO_2$ conducting glass (FTO) or the like; and 6. a glass substrate.

Figure 2:
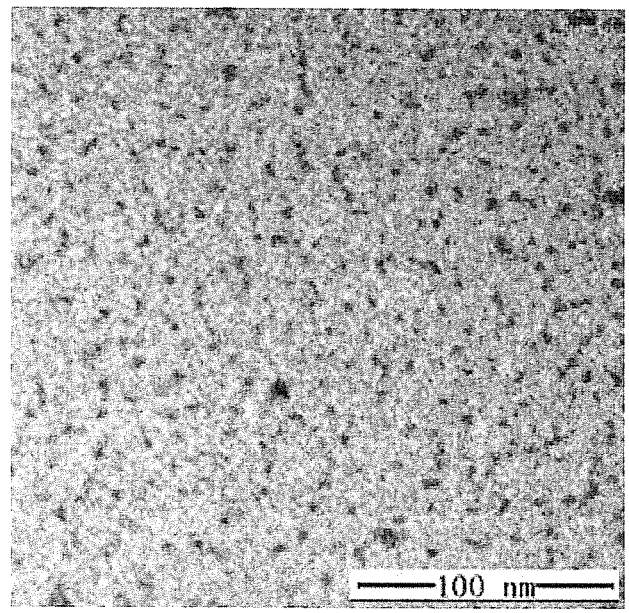

FIG. 2 shows a transmission electron micrograph of the CdTe nanocrystals prepared according to the invention.

It can be seen in the figure that the CdTe nanocrystals have a uniform size distribution and an average particle size of 2.8 nm.

Figure 3:
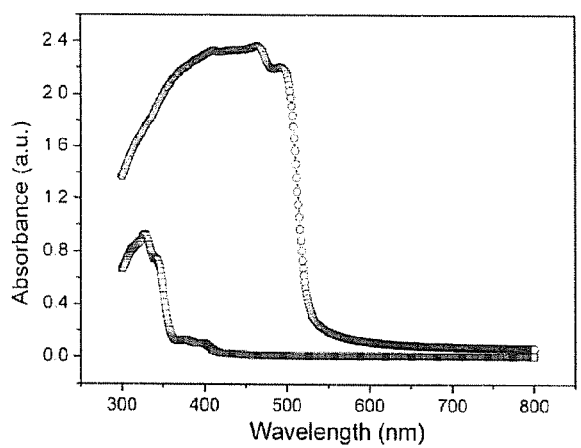

FIG. 3 shows the ultraviolet-visible absorption spectra of the pure PPV film prepared according to the invention before and after being heated (320° C., 60 min).

In the FIG. 3, the dot line of black squares represents the absorption spectrum before heating, and the dot line of black circles represents the absorption spectrum after heating. It can be seen from the figure that the absorption peak position of PPV is at 328 nm before heating, and the absorption peak position thereof red-shifts to 428 nm after heating.

Figure 4:
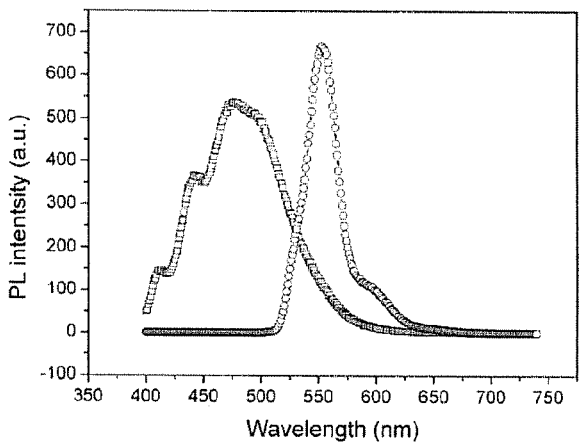

FIG. 4 shows photoluminescence spectra of the pure PPV film prepared according to the method of the invention before and after being heated (320° C., 60 min).

In the FIG. 4, the dot line of black squares represents the emission spectrum before heating, and the dot line of black circles represents the emission spectrum after heating. It can be seen from the figure that the photoluminescent peak is wider and has the peak position at 475 nm before heating, and the photoluminescent peak of the PPV film becomes narrower remarkably and has the peak position at 553 nm after heating; [see Reference: R. H. Friend, R. W. Gymer, et al, Nature 1999, 397, 121.]

Figure 5:
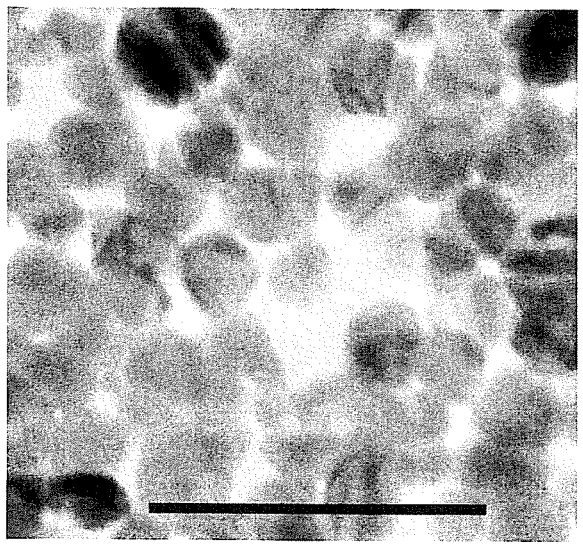

FIG. 5 shows a transmission electron micrograph of the PPV:CdTe composite thin film (heated at 320° C. for 60 min) prepared according to the invention.

In the FIG. 5, CdTe has a concentration of 30 mg/ml, PPV has a concentration of 1.8 mg/ml, and the average particle size of the nanocrystals is 22 nm. The substantial increase of the average size of the nanocrystals indicates that the nanocrystals have grown remarkably during heating.

Figure 6:
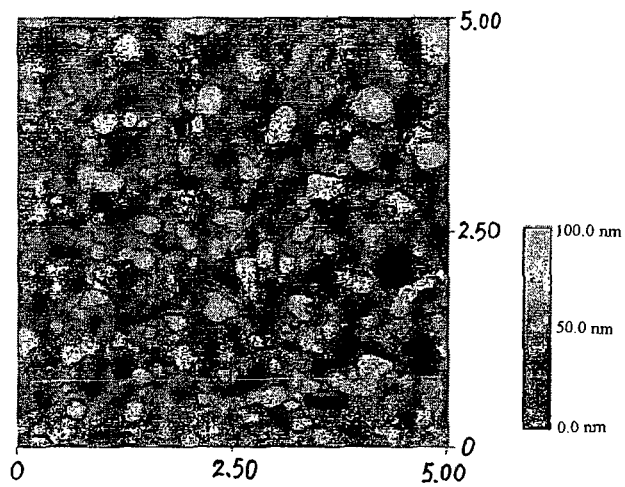

FIG. 6 shows the surface morphology of the PPV: CdTe composite film.

In the FIG. 6, CdTe has a concentration of 30 mg/ml and PPV has a concentration of 1.8 mg/ml. It can be seen from the figure that the CdTe nanocrystals are aggregated, and the average roughness of the thin film surface is 11.01 nm.

Figure 7:
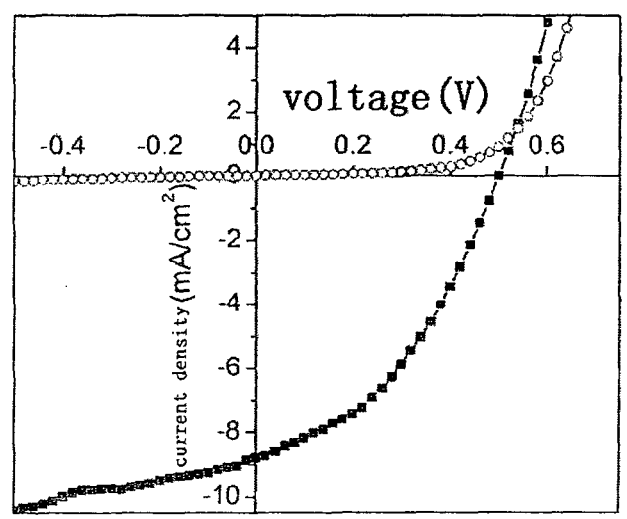

FIG. 7 shows the current-voltage characteristic curves of the solar cell prepared according to the invention under dark state and under the irradiation of AM1.5 simulative sunlight.

In the FIG. 7, the dot line of black squares represents the current-voltage curve under the light irradiation, and the dot line of black circles represents the current-voltage curve of the cell under the dark state. From this figure, we can obtain the open circuit voltage (0.50 V) and the short circuit current density (8.79 mA/cm$^2$) of the cell under the light irradiation, and calculate the fill factor (0.40) and the cell energy conversion efficiency (1.76%) based on the following specific calculation formula:

$$PCE = \frac{P_{max}}{P_{light}} = \frac{J_{SC} \cdot V_{OC} \cdot FF}{P_{light}} \times 100\%$$

$$FF = \frac{J_{max} \cdot V_{max}}{J_{SC} \cdot V_{OC}} \times 100\%$$

wherein, PCE is the energy conversion efficiency; $J_{sc}$ is the short circuit current density; $V_{OC}$ is the open circuit voltage; FF is the fill factor; $J_{max} \cdot V_{max}$ is the product of the maximal voltage and maximal current of the cell; $P_{max}$ is the maximal output power of the cell, and $P_{light}$ is the power of the incident light (100 mW/cm$^2$).

BEST MODES FOR CARRYING OUT THE INVENTION

In the invention, a solar cell having a bulk structure is produced by hybridizing fully aqueous phase-synthesized semiconductor nanocrystals (such as, cadmium telluride (CdTe), cadmium selenide (CdSe), cadmium sulfide (CdS) nanocrystals or the like) and an aqueous phase-synthesized conducting polymer (poly(para-phenylene vinylene) (PPV) and the derivatives thereof and the like) precursor to form a photoactive material.

The invention includes the steps of: 1. preparing high quality semiconductor nanocrystals in an aqueous phase; 2. preparing a PPV precursor in an aqueous phase; and 3. producing a solar cell by forming a coating film from the mixed solution of the semiconductor nanocrystals and the PPV precursor.

Specifically, the invention has the following steps:

1. The Preparation of an Aqueous Solution of CdTe, CdSe, or CdS Semiconductor Nanocrystals in an Aqueous Phase A metal cadmium source (CdCl$_2$ or Cd(Ac)$_2$.2H$_2$O or the like) and mercaptoethylamine ligand are added to an aqueous solution, wherein the concentration of Cd$^{2+}$ is $1.0 \times 10^{-3}$ M-$3.0 \times 10^{-2}$ M, and the molar ratio of Cd$^{2+}$ to mercaptoethylamine is 1:1.2-1:3.0. PH of the reaction system is adjusted to be weakly acidic with a NaOH solution having a concentration of 0.1 M-1 M. N$_2$ gas is bubbled for 10-30 min to remove oxygen in the solution. Then, an aqueous NaHTe solution is rapidly added to the mixed solution of CdCl$_2$ and mercaptoethylamine, wherein the molar ratio of Cd$^{2+}$ to NaHTe is 1:0.01-1:0.5. Finally, the freshly prepared mixed solution is refluxed for 0.5-48 hours at a temperature of 80-100° C. With the lapse of the refluxing time, CdTe nanocrystal solution having a particle size (diameter) from 2.2 nm to 3.8 nm and a fluorescence from green light to red light (under light irradiation at 360 nm) can be obtained by sampling at different stages.

The above method of the invention can also be used to prepare various semiconductor nanocrystals of CdSe or CdS or the like, except that NaHTe is replaced by NaHSe with the same concentration when CdSe nanocrystals are prepared; and the NaHTe solution is replaced by the continually introduced H$_2$S gas (H$_2$S gas is introduced into the reaction system for 30 min to 24 hours) when CdS nanocrystals are prepared. The resulting CdSe has a particle diameter of 2.0 nm to 6.8 nm. The resulting CdS has a particle diameter of 2.0 nm to 7.0 nm.

2. The Preparation of the Conjugated Polymer Precursor Solution in an Aqueous Phase To a three-necked flask equipped with a stirrer, a condenser and a thermometer, p-di(chloromethyl)benzene and thiophane are added in a molar ratio of 1:3. 20-60 ml of a good solvent for the conjugated polymer (water, methanol, ethanol, isopropanol, or a mixed solvent thereof) is used as the reaction medium. The mixture is reacted in an oil bath at 50° C.-60° C. for 24 h-48 h while keeping the concentration of p-di(chloromethyl)benzene in methanol as a good solvent for the conjugated polymer in a range of 8.57 mM-25.7 mM. Then, 125-375 ml of cold acetone (0° C.) is added to the reaction solution, and the precipitated white precipitate is filtered and then washed with cold acetone for 5-8 times. Finally, the precipitated product is placed into a vacuum oven and dried to a constant weight at 30-60° C. so as to obtain a product of disulfonium salt, that is, disulfonium dichloride of p-phenylene dimethylene α, α'-bisthiophane, represented by the following structural formula:

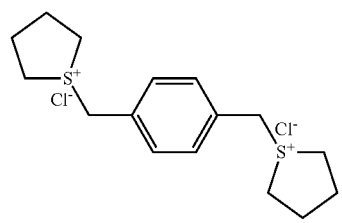 [SMILES: c1cc(C[S+]2CCCC2)ccc1C[S+]1CCCC1 ; [Cl-] ; [Cl-]]

To a four-necked flask equipped with a constant pressure dropping funnel, a stirrer, a $N_2$ gas inlet tube and a $N_2$ gas outlet tube, a solution of 0.2-0.6 M of the disulfonium salt as prepared in the above step in a good solvent for the conjugated polymer (water, methanol, ethanol, isopropanol, or a mixed solvent thereof) and an aqueous solution of equal molar NaOH are added. The solution is kept at a temperature of 0-10° C. and the reaction is performed for 0.5-2 h. Then, the reaction is terminated by neutralization with 0.1-1 M of hydrochloric acid until pH becomes 6.5-7.5. Then, the reaction product is poured into a dialysis bag (MD36, with a cut-off molecular weight of 8000-14000) and dialyzed for 1 week with deionized water to remove the extra small molecules and obtain a solution of poly(para-phenylene vinylene) (PPV) precursor. The concentration of the PPV precursor is calculated from the product obtained by drying the PPV precursor solution with a predetermined mass and polymerizing the same for 2 hours at 320° C. The solid content of the PPV precursor solution is calculated as 2%-5% by mass. PPV is represented by the following structural formula:

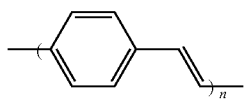

wherein, n=392-980.

The PPV precursor solution as prepared according to the invention can be freeze-dried and re-dispersed into a good solvent for the conjugated polymer (water, methanol, ethanol, isopropanol, or a mixed solvent thereof) at the same concentration.

The above method of the invention can also be used to prepare a PPV derivative, that is, poly(2,5-dialkoxy-para-phenylene vinylene) precursor under the same experimental parameter conditions, except that p-di(chloromethyl)benzene is replaced by 2,5-dialkoxy-1,4-p-di(chloromethyl) benzene. The disulfonium salt (disulfonium dichloride of 2,5-dialkoxy-p-phenylene dimethylene α, α'-bisthiophane) and its polymer obtained by the process are represented by the following molecular structural formulae a) and b), respectively.

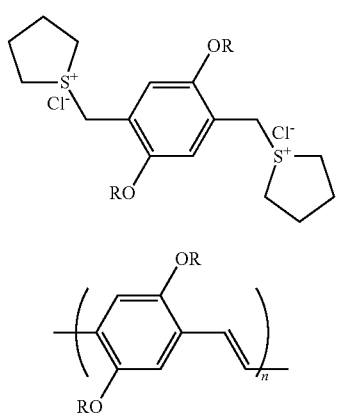

wherein, n=392-980; R is $C_mH_{2m+1}$, and in is an integer of 1-8.

The above conjugated polymer can also be poly(phenylene vinylene-co-2,5-dialkoxy-para-phenylene vinylene).

3. The Production of the Nanocrystals/Conducting Polymer Hybrid Solar Cell

The solar cell has the structure constituted by conducting anode/electron blocking layer/active layer/hole blocking layer/metal cathode in this order. Firstly, the aqueous solution of CdTe, CdSe or CdS nanocrystals is added with isopropanol and subjected to centrifugal sedimentation at high speed so as to obtain a nanocrystal precipitate. Then, the precipitate of CdTe, CdSe or CdS nanocrystals is mixed with a solution of PPV or poly(2,5-dialkoxy-para-phenylene vinylene) precursor in different mass ratios (from 1:1 to 10:1) (preferably a mass ratio of 1:6-10:1). Then, a film (20 nm to 500 nm) is formed by spin-coating the mixed solution onto a surface of a conducting anode or the surface of a conducting anode covered with an electron blocking layer. After the film is dried, the film is transferred into a glove box filled with nitrogen gas and heated therein for 10 to 120 min. During the process of heating, the residual solvent molecules (water, isopropanol) in the thin film volatilize, and at the same time, the PPV or poly(2,5-dialkoxy-para-phenylene vinylene) precursor performs condensation polymerization to form PPV or poly(2,5-dialkoxy-para-phenylene vinylene) and the mercaptoethylamine ligands are desorbed from the surfaces of the CdTe, CdSe or CdS nanocrystals so that the nanocrystals are linked to each other, thereby forming an active layer having an interpenetrating network structure of PPV (or poly(2,5-dialkoxy-para-phenylene vinylene)) and CdTe, CdSe or CdS nanocrystals. Finally, the device is transferred into a vacuum evaporation apparatus, and a hole blocking layer and a metal cathode are evaporated or spin-coated on the active layer so as to produce the solar cell of the invention as shown in FIG. 1.

In the invention, Ca, Mg, Al, Mg/Ag or Ca/Al (a structure of double-layer electrode) is used as the metal cathode; indium tin oxide (ITO), or fluorine-doped $SnO_2$ conducting glass (FTO) is used as the conducting anode; poly(3,4-ethylenedioxythiophene)/poly(styrene sulfonic acid) (PEDOT:PSS), molybdenum trioxide ($MoO_3$), vanadium pentoxide ($V_2O_5$), or tungsten oxide ($WO_3$) is used as the electron blocking layer; and 2,9-dimethyl-4,7-diphenyl-1,10-ortho-phenanthroline (BCP), ZnO nanocrystals, $TiO_2$ nanocrystals, or LiF is used as the hole blocking layer.

The invention is further described below with reference to examples, but not limited thereto.

Example 1

1: The Synthesis of CdTe Nanocrystals

Firstly, 0.51 g of Te powders were added into 6 ml of deionized water and then 0.34 g of $NaBH_4$ was added thereto. The mouth of the bottle was sealed with a sealing film and a needle was inserted therein. The contents in the bottle were stirred in an ice water bath. When there was no more bubble produced in the solution, the reaction was stopped so as to obtain a NaHTe solution with a concentration of ⅔ M.

0.280 g of mercaptoethylamine ligand was added to 60 ml of deionized water and mixed uniformly under stirring, and then 9.4 ml of 0.1 M aqueous $CdCl_2$ solution was added thereto. After the resulting solution was stirred uniformly, an aqueous NaOH solution was added to adjust pH to be 5.75. $N_2$ gas was bubbled for 15 min to remove oxygen in the solution. Thereafter, under the protection of $N_2$ gas, 0.28 ml of a NaHTe solution (with a concentration of ⅔ M) was added rapidly and the solution changed from colorless to red brown immediately. Then, the solution was heated at 100° C. for 25 min to obtain CdTe nanocrystals having a particle diameter of 2.8 nm and green fluorescence, as shown in FIG. 2.

2: The Preparation of PPV Precursor in an Aqueous Phase

To a three-necked flask equipped with a stirrer, a condenser and a thermometer, p-di(chloromethyl)benzene (17.1 mM) and thiophane (51.3 mM) were added. 40 ml of methanol was used as the reaction medium. The mixture was reacted in an oil bath at 50° C. for 24 h. Then, 250 ml of cold acetone (0° C.) was added to the reaction solution, and the white precipitate was precipitated. The white precipitate was filtered and then washed with cold acetone for 5-8 times. The product was placed into a vacuum oven and dried to a constant weight at 45° C. so as to obtain 1.224 g of a disulfonium salt (disulfonium dichloride of p-phenylene dimethylene α, α'-bisthiophane).

To a four-necked flask equipped with a constant pressure dropping funnel, a stirrer, a $N_2$ gas inlet tube and a $N_2$ gas outlet tube, a methanol solution (11.06 ml) of 0.4 M of the above disulfonium salt and an aqueous solution of equal molar NaOH (0.4 M, 11.06 ml) were added. The solution was kept at a temperature of 0° C. After the reaction was performed for 1 h, the reaction was terminated by neutralization with 0.5 M hydrochloric acid until pH became 7. Then, the reaction product was poured into a dialysis bag (MD36, with a cut-off molecular weight of 8000) and dialyzed for 1 week with deionized water to remove the extra small molecules and obtain a PPV precursor with a mass concentration of 5%, as shown in FIGS. 3 and 4. The compound has the structural formula as described above, wherein n=784.

3: The Production of a CdTe/PPV Hybrid Solar Cell

An electron blocking layer (30 nm) of PEDOT:PSS was spin-coated on a surface of indium tin oxide (ITO) and was heated on a heating stage at 150° C. for 30 min to be dried sufficiently. An aqueous CdTe nanocrystal solution was added with isopropanol and subjected to centrifugal sedimentation at high speed (15,000 rpm, 5 min) so as to obtain a nanocrystal precipitate. The CdTe nanocrystal precipitate was mixed with an aqueous PPV precursor solution (with a mass concentration of 5%) in a mass ratio of 10:1. Then, the mixed solution was spin-coated onto the surface of indium tin oxide (ITO) to form a film. After the film was dried, the film was transferred into a glove box filled with nitrogen gas and heated at 320° C. for 60 min. The transmission morphology and surface morphology of the resulting active layer were shown in FIGS. 5 and 6. ZnO (30 nm) [For the synthesis of ZnO nanocrystals, see the reference: W. J. E. Beek, M. M. Wienk, et al, *Journal of Physical Chemistry* B 2005, 109, 9505] was spin-coated on the active layer. Then, the device was transferred into a vacuum evaporation apparatus and evaporated with metal aluminum (100 nm). The performance parameters of the obtained solar cell were: an open circuit voltage of 0.50 V; a short circuit current density of 8.79 $mA/cm^2$; a fill factor of 0.40; and a cell PCE of 1.76%, as shown in FIG. 7.

Example 2

1: CdTe Nanocrystals were Synthesized as Described in the Example 1.

2: The Preparation of Poly(2,5-dialkoxy-para-phenylene vinylene) Precursor as a PPV Derivative To a three-necked flask equipped with a stirrer, a condenser and a thermometer, 2,5-dialkoxy-1,4-p-di(chloromethyl)benzene (17.1 mM) and thiophane (51.3 mM) were added. 40 ml of methanol was used as the reaction medium. The mixture was reacted in an oil bath at 50° C. for 24 h. 250 ml of cold acetone (0° C.) was added to the reaction solution, and the white precipitate was precipitated. The white precipitate was filtered and washed with cold acetone for 5-8 times. The product was placed into a vacuum oven and dried to a constant weight at 45° C. so as to obtain 1.504 g of a disulfonium salt (disulfonium dichloride of 2,5-dialkoxy-p-phenylene dimethylene α, α'-bisthiophane).

To a four-necked flask equipped with a constant pressure dropping funnel, a stirrer, a $N_2$ gas inlet tube and a $N_2$ gas outlet tube, a methanol solution (11.06 ml) of 0.4 M of the above disulfonium salt and an aqueous solution of equal molar NaOH (0.4 M, 11.06 ml) were added. The solution was kept at a temperature of 0° C. After the reaction was performed for 1 h, the reaction was terminated by neutralization with 0.5 M hydrochloric acid until pH became 7. Then, the reaction product was poured into a dialysis bag (MD36, with a cut-off molecular weight of 8000) and dialyzed for 1 week with deionized water to remove the extra small molecules and obtain a solution of poly(2,5-dialkoxy-para-phenylene vinylene) precursor with a mass concentration of 4.8%. [see the reference: Paul L. Burn, Amo Kraft, et al, J. Am. Chem. SOC. 1993, 115, 10117]. The compound has the structural formula as described above, wherein n=784, and m=1.

3. The Hybrid Solar Cell was Produced as Described in the Example 1.

The performance parameters of the obtained solar cell were: an open circuit voltage of 0.37 V; a short circuit current density of 8.79 $mA/cm^2$; a fill factor of 0.40; and a cell PCE of 1.30%.

Example 3

1: CdTe Nanocrystals were Synthesized as Described in the Example 1.

2: The Preparation of PPV Precursor

To a three-necked flask equipped with a stirrer, a condenser and a thermometer, p-di(chloromethyl)benzene (17.1 mM) and thiophane (51.3 mM) were added. 40 ml of methanol was used as the reaction medium. The mixture was reacted in an oil bath at 50° C. for 24 h. Then, 250 ml of cold acetone (0° C.) was added into the reaction solution, and the white precipitate was precipitated. The white precipitate was filtered and washed with cold acetone for 5-8 times. The product was placed into a vacuum oven and dried to a constant weight at 45° C. so as to obtain 1.224 g of a disulfonium salt.

To a four-necked flask equipped with a constant pressure dropping funnel, a stirrer, a $N_2$ gas inlet tube and a $N_2$ gas outlet tube, a methanol solution (11.06 ml) of 0.4 M of the above disulfonium salt and an aqueous solution of equal molar NaOH (0.4 M, 11.06 ml) were added. The solution was kept at a temperature of 0° C. After the reaction was performed for 1 h, the reaction was terminated by neutralization with 0.5 M hydrochloric acid until pH became 7. Then, the reaction product was poured into a dialysis bag (MD36, with a cut-off molecular weight of 8000) and the resulting mixed solution of the precursor was dialyzed for 1 week with deionized water so as to obtain a PPV precursor. The precursor was freeze-dried under high vacuum and then re-dispersed in an ethanol phase at the same concentration. The compound has the structural formula as described above, wherein n=784.

3. The Hybrid Solar Cell was Produced as Described in the Example 1.

The performance parameters of the obtained device were: an open circuit voltage of 0.36 V; a short circuit current density of 10.5 mA/cm$^2$; a fill factor of 0.40; a cell PCE of 1.51%.

Example 4

1: CdTe Nanocrystals were Synthesized as Described in the Example 1.

2: PPV Precursor was Prepared in an Aqueous Phase as Described in the Example 1.

3: The Production of a CdTe/PPV Hybrid Solar Cell 5 nm vanadium pentoxide (V$_2$O$_5$) was evaporated on a surface of indium tin oxide (ITO) under vacuum. An aqueous CdTe nanocrystal solution was added with isopropanol and subjected to centrifugal sedimentation at high speed (15,000 rpm, 5 min) so as to obtain a nanocrystal precipitate. The CdTe nanocrystal precipitate was mixed with an aqueous PPV precursor solution (with a mass concentration of 5%) in a mass ratio of 10:1. Then, the mixed solution was spin-coated onto the surface of indium tin oxide (ITO) evaporated with V$_2$O$_5$ to form a film (200 nm). After the film was dried, the film was transferred into a glove box filled with nitrogen gas and heated at 320° C. for 60 min. Then, the device was transferred into a vacuum evaporation apparatus and ZnO (30 nm) and metal aluminum (100 nm) were evaporated on the active layer. The performance parameters of the obtained device were: an open circuit voltage of 0.44 V; a short circuit current density of 6.5 mA/cm$^2$; a fill factor of 0.40; and a cell PCE of 1.14%.

Example 5

1: CdTe Nanocrystals were Synthesized as Described in the Example 1.

2: PPV Precursor was Prepared in an Aqueous Phase as Described in the Example 1.

3: The Production of a CdTe/PPV Hybrid Solar Cell

An electron blocking layer (30 nm) of PEDOT:PSS was spin-coated on a surface of indium tin oxide (ITO) and was heated on a heating stage at 150° C. for 30 min to be dried sufficiently. Then, the CdTe nanocrystal precipitate was mixed with an aqueous PPV precursor solution in a mass ratio of 10:1, and the mixed solution was spin-coated onto the surface of indium tin oxide (ITO) to form a film. After the film was dried, the film was transferred into a glove box filled with nitrogen gas and heated at 320° C. for 60 min. Then, a layer of LiF (this layer had a thickness of 0.7 nm and was used as the hole blocking layer) was evaporated on the surface of the active layer under vacuum. Finally, the device was transferred into a vacuum evaporation apparatus and was evaporated with 100 nm metal aluminum. The performance parameters of the obtained device were: an open circuit voltage of 0.52 V; a short circuit current density of 8.82 mA/cm$^2$; a fill factor of 0.30; and a cell PCE of 1.38%.

Example 6

1: CdTe Nanocrystals were Synthesized as Described in the Example 1.

2: PPV Precursor was Prepared in an Aqueous Phase as Described in the Example 1.

3: The Production of a CdTe/PPV Hybrid Solar Cell

An aqueous CdTe nanocrystal solution was added with isopropanol and subjected to centrifugal sedimentation at high speed (15,000 rpm, 5 min) so as to obtain a nanocrystal precipitate. The CdTe nanocrystal precipitate was mixed with an aqueous PPV precursor solution (with a concentration of 5%) in a mass ratio of 10:1, and then the mixed solution was spin-coated onto the surface of indium tin oxide (ITO) to form a film (200 nm). After the film was dried, the film was transferred into a glove box filled with nitrogen gas and heated at 320° C. for 60 min. During the process of heating, the PPV precursor performed condensation polymerization to form PPV and at the same time and the mercaptoethylamine ligands were desorbed from the surfaces of the CdTe nanocrystals so that the nanocrystals were linked to each other, thereby forming an active layer having an interpenetrating network structure of PPV and CdTe. Then, the device was transferred into a vacuum evaporation apparatus and 0.7 nm LiF and 100 nm metal aluminum were evaporated on the active layer. The obtained device had an open circuit voltage of 0.38 V; a short circuit current density of 11.2 mA/cm$^2$; a fill factor of 0.30; and a cell PCE of 1.28%.

Example 7

1: CdTe Nanocrystals were Synthesized as Described in the Example 1.

2: PPV Precursor was Prepared in an Aqueous Phase as Described in the Example 1.

3: The Production of a CdTe/PPV Hybrid Solar Cell

An aqueous CdTe nanocrystal solution was added with isopropanol and subjected to centrifugal sedimentation at high speed (15,000 rpm, 5 min) so as to obtain a nanocrystal precipitate. The CdTe nanocrystal precipitate was mixed with an aqueous PPV precursor solution (with a concentration of 5%) in a mass ratio of 10:1 and then the mixed solution was spin-coated onto the surface of indium tin oxide (ITO) to form a film (200 nm). After the film was dried, the film was transferred into a glove box filled with nitrogen gas and heated at 320° C. for 60 min. Then, the device was transferred into a vacuum evaporation apparatus and ZnO (30 nm) and metal aluminum (100 nm) were spin-coated on the active layer. The performance parameters of the obtained solar cell were: an open circuit voltage of 0.36 V; a short circuit current density of 11.25 mA/cm$^2$; a fill factor of 0.40; and a cell PCE of 1.62%.

What is claimed is:

1. A method for producing a fully aqueous phase-synthesized semiconductor nanocrystals/conducting polymer hybrid solar cell, comprising:
    (1) preparing an aqueous semiconductor nanocrystal solution in an aqueous phase;
    (2) preparing a conducting polymer precursor solution in an aqueous phase;
    (3) separating the semiconductor nanocrystals from the aqueous semiconductor nanocrystal solution;
    (4) preparing a mixed solution by mixing the separated semiconductor nanocrystals with the conducting polymer precursor solution in a mass ratio of 1:1 to 10:1;
    (5) forming a film by coating the mixed solution on a surface of a conducting anode or the surface of a conducting anode covered with an electron blocking layer and drying the same;
    (6) forming an active layer having an interpenetrating network structure of the conducting polymer and the semiconductor nanocrystals by heating the film under nitrogen gas; and (7) evaporating or spin-coating a hole blocking layer and a metal cathode on the active layer in this order so as to produce the nanocrystals/conducting polymer hybrid solar cell.

2. The method for producing a fully aqueous phase-synthesized semiconductor nanocrystals/conducting polymer hybrid solar cell according to claim 1, wherein the conducting polymer is poly(para-phenylene vinylene), poly(2,5-dialkoxy-para-phenylene vinylene), or poly(phenylene vinylene-co-2,5-dialkoxy-para-phenylene vinylene).

3. The method for producing a fully aqueous phase-synthesized semiconductor nanocrystals/conducting polymer hybrid solar cell according to claim 2, wherein the conducting polymer is poly(para-phenylene vinylene), and the poly(para-phenylene vinylene) precursor solution is prepared by:
reacting p-di(chloromethyl)benzene and thiophane in a molar ratio of 1:3 in a solvent for the poly(para-phenylene vinylene) precursor at 50-60° C. to obtain disulfonium dichloride of p-phenylene dimethylene α,α'-bisthiophane;
reacting a solution of disulfonium dichloride of p-phenylene dimethylene α,α'-bisthiophane and an aqueous solution of equal molar NaOH under nitrogen gas and at 0-10° C.; then
dialyzing the resulting reaction product to obtain the poly(para-phenylene vinylene) precursor solution.

4. The method for producing a fully aqueous phase-synthesized semiconductor nanocrystals/conducting polymer hybrid solar cell according to claim 3, wherein solvent is water, methanol, ethanol, isopropanol, or a mixed solvent thereof.

5. The method for producing a fully aqueous phase-synthesized semiconductor nanocrystals/conducting polymer hybrid solar cell according to claim 2, wherein the conducting polymer is poly(2,5-dialkoxy-para-phenylene vinylene), and the poly(2,5-dialkoxy-para-phenylene vinylene) precursor solution is prepared by:
reacting 2,5-dialkoxy-1, 4-p-di(chloromethyl)benzene and thiophane in a molar ratio of 1:3 in a solvent for the poly(2,5-dialkoxy-para-phenylene vinylene) precursor at 50-60° C. to obtain disulfonium dichloride of 2,5-dialkoxy-p-phenylene dimethylene α,α'-bisthiophane;
reacting a solution of disulfonium dichloride of 2,5-dialkoxy-p-phenylene dimethylene α,α'-bisthiophane and an aqueous solution of equal molar NaOH under nitrogen gas and at 0-10° C.; then
dialyzing the resulting reaction product to obtain the poly(2,5-dialkoxy-para-phenylene vinylene) precursor solution.

6. The method for producing a fully aqueous phase-synthesized semiconductor nanocrystals/conducting polymer hybrid solar cell according to claim 5, wherein the solvent is water, methanol, ethanol, isopropanol, or a mixed solvent thereof.

7. The method for producing a fully aqueous phase-synthesized semiconductor nanocrystals/conducting polymer hybrid solar cell according to claim 1, wherein the semiconductor nanocrystals are cadmium telluride, cadmium selenide, or cadmium sulfide.

8. The method for producing a fully aqueous phase-synthesized semiconductor nanocrystals/conducting polymer hybrid solar cell according to claim 7, wherein the nanocrystals of cadmium telluride, cadmium selenide, or cadmium sulfide are prepared by introducing an aqueous NaHTe solution, an aqueous NaHSe solution or $H_2S$ gas into a weakly acidic aqueous solution containing a metal cadmium source and mercaptoethylamine and performing the reaction, respectively.

9. The method for producing a fully aqueous phase-synthesized semiconductor nanocrystals/conducting polymer hybrid solar cell according to claim 1, wherein the material for the metal cathode is Ca, Mg, Al, Mg/Ag or Ca/Al.

10. The method for producing a fully aqueous phase-synthesized semiconductor nanocrystals/conducting polymer hybrid solar cell according to claim 1, wherein the material for the conducting anode is indium tin oxide or fluorine-doped $SnO_2$ conducting glass.

11. The method for producing a fully aqueous phase-synthesized semiconductor nanocrystals/conducting polymer hybrid solar cell according to claim 1, wherein the material for the electron blocking layer is poly(3,4-ethylenedioxythiophene)/poly(styrene sulfonic acid), molybdenum trioxide, vanadium pentoxide, or tungsten oxide.

12. The method for producing a fully aqueous phase-synthesized semiconductor nanocrystals/conducting polymer hybrid solar cell according to claim 1, wherein the material for the hole blocking layer is 2,9-dimethyl-4,7-diphenyl-1,10-ortho-phenanthroline, ZnO nanocrystals, $TiO_2$ nanocrystals, or LiF.

* * * * *